United States Patent
Kusumoto

(10) Patent No.: US 7,312,849 B2
(45) Date of Patent: Dec. 25, 2007

(54) SUBSTRATE ALIGNMENT APPARATUS AND METHOD, AND EXPOSURE APPARATUS

(75) Inventor: Hiroshi Kusumoto, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/548,360

(22) Filed: Oct. 11, 2006

(65) Prior Publication Data

US 2007/0127026 A1    Jun. 7, 2007

Related U.S. Application Data

(63) Continuation of application No. 10/765,390, filed on Jan. 28, 2004, now Pat. No. 7,136,165.

(30) Foreign Application Priority Data

Jan. 31, 2003    (JP)    ............... 2003-024964

(51) Int. Cl.
  *G03B 27/42*    (2006.01)
  *G01B 11/00*    (2006.01)
(52) U.S. Cl. ........................ 355/53; 356/401
(58) Field of Classification Search ........ 356/399–401, 356/614; 250/548, 559; 355/53; 414/331, 414/935–941
  See application file for complete search history.

(56) References Cited

U.S. PATENT DOCUMENTS

| | | | |
|---|---|---|---|
| 4,648,708 A | | 3/1987 | Kosugi .................. 355/53 |
| 4,818,169 A | * | 4/1989 | Schram et al. ......... 414/331.18 |
| 5,194,743 A | * | 3/1993 | Aoyama et al. ............ 250/548 |
| 5,238,354 A | | 8/1993 | Volovich .................... 414/779 |
| 5,506,684 A | * | 4/1996 | Ota et al. ................... 356/401 |
| 5,783,754 A | * | 7/1998 | MacPherson ............ 73/862.03 |
| 5,925,835 A | | 7/1999 | Solanki et al. ............ 73/865.9 |
| 6,002,840 A | | 12/1999 | Hofmeister .................. 395/80 |
| 6,366,830 B2 | | 4/2002 | Bacchi et al. ............... 700/250 |
| 6,495,847 B1 | * | 12/2002 | Asano et al. ............... 250/548 |
| 7,075,618 B2 | * | 7/2006 | Ina et al. ....................... 355/53 |
| 2002/0063856 A1 | * | 5/2002 | Inoue ........................... 355/53 |
| 2002/0148975 A1 | | 10/2002 | Kimba et al. ............ 250/492.1 |
| 2003/0020889 A1 | * | 1/2003 | Takahashi .................... 355/53 |

\* cited by examiner

*Primary Examiner*—Layla G. Lauchman
*Assistant Examiner*—Jarreas Underwood
(74) *Attorney, Agent, or Firm*—Fitzpatrick, Cella, Harper & Scinto

(57) ABSTRACT

A substrate alignment apparatus which aligns and fixes a substrate on a substrate stage includes a chucking pad fixed on the substrate stage to chuck and fix the substrate, a moving unit which moves the substrate with respect to the substrate stage such that a mark on the substrate stage and a mark on the substrate coincide with each other, and a determination unit which evaluates and controls a relative position between the chucking pad and the substrate after movement by the moving unit and determines whether the chucking pad can normally chuck the substrate.

9 Claims, 10 Drawing Sheets

F I G. 10
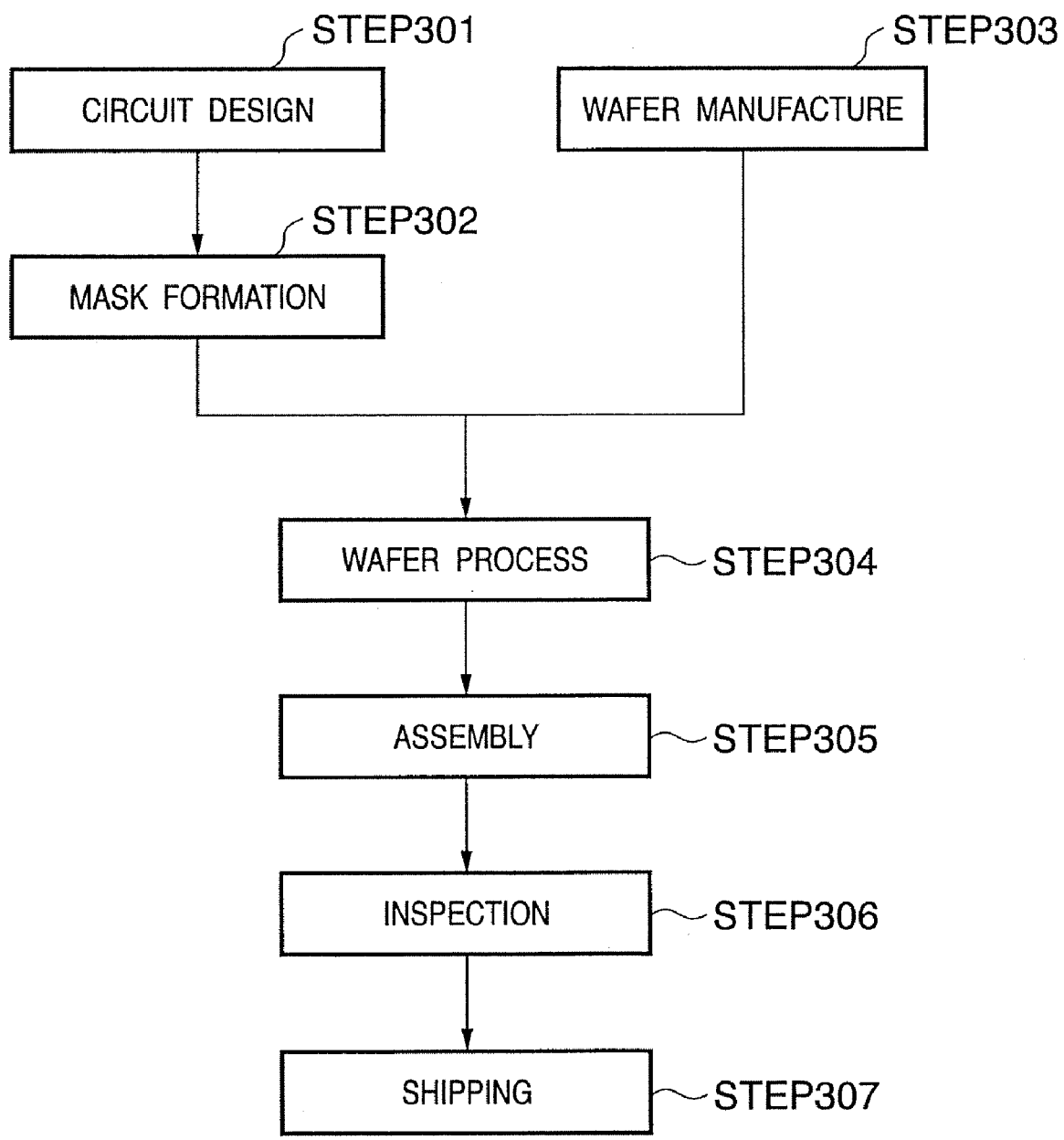

SUBSTRATE ALIGNMENT APPARATUS AND METHOD, AND EXPOSURE APPARATUS

This application is a continuation application of U.S. patent application Ser. No. 10/765,390, filed Jan. 28, 2004 now U.S. Pat. No. 7,136,165.

FIELD OF THE INVENTION

The present invention relates to a substrate alignment apparatus which can be applied to an exposure apparatus for manufacturing a semiconductor circuit, such as an IC, LSI, or the like, and, more particularly, to a substrate alignment apparatus suitable for aligning a reticle.

BACKGROUND OF THE INVENTION

In the manufacture of a semiconductor device, such as an IC, LSI, or the like, a plurality of circuit patterns are overlaid on a wafer. Each circuit pattern is drawn on a reticle and is transferred onto a wafer by exposure. In an exposure apparatus which performs exposure, a reticle and a wafer are placed on a reticle stage and a wafer stage, respectively. Alignment is performed such that a circuit pattern on the reticle is transferred to a circuit formation position of the wafer. With this exposure, a new circuit pattern is overlaid on a transferred circuit pattern on the wafer. By repeating this, a circuit having a plurality of overlapping patterns can be formed on the wafer.

In an exposure apparatus, a wafer and a reticle are aligned with each other for each of a plurality of circuit formation positions on the wafer by moving the wafer, i.e., driving a wafer stage in order to transfer a circuit pattern of the reticle to each circuit formation position. To implement this alignment of the wafer and reticle, a reticle stage and the wafer stage are aligned with each other, then a reticle and the reticle stage are aligned with each other, thereby defining a relative positional relationship between the reticle and the wafer stage.

The center position of each circuit pattern drawn on the reticle shifts from the center position of the reticle itself. For this reason, to align the reticle stage and reticle with each other, a reticle alignment mark, which has been drawn on the reticle together with the circuit pattern, is detected, and the reticle is fixed on the reticle stage such that the reticle alignment mark overlaps with a reticle reference mark arranged on the reticle stage.

The reticle is arranged on a reticle chucking pad on the reticle stage and is chucked by the chucking pad, thereby fixing it on the reticle stage. To align the reticle alignment mark and reticle reference mark with each other, there are available the following two arrangements.

(1) A reticle stage, having a mechanism which enables a reticle chucking pad to move on the reticle stage, is used. The reticle chucking pad on the reticle stage is moved while chucking the reticle.

(2) A reticle stage having a fixed reticle chucking pad is used. A reticle is moved by another unit before chucking the reticle with the reticle chucking pad, and a relative position between the reticle and the reticle stage is changed, thereby aligning the reticle. After completion of the alignment, the reticle chucking pad chucks the reticle to fix it on the reticle stage.

In a scanning exposure apparatus, a reticle stage exposes a wafer while scanning it. Providing on the reticle stage a mechanism (the arrangement (1)) which allows the chucking pad to move increases the weight of the reticle stage and the complexity of the apparatus, and, thus, is hard to adopt. For this reason, a scanning exposure apparatus generally adopts an alignment method which uses the arrangement (2).

In, e.g., a reticle 100, as shown in FIG. 5, reticle alignment marks 101, as well as a circuit pattern, are drawn on a reticle pattern surface 104. The reticle 100 is placed such that the position of each of the reticle alignment marks 101 coincides with that of each of reticle reference marks 111, as shown in FIG. 6, and is fixed on a reticle stage 110 by chucking pads 112. FIGS. 5 and 6 show cases wherein a center position 102 of the reticle pattern surface 104 of the reticle 100 coincides with a center position 103 of the reticle itself.

However, if the circuit pattern drawn on the reticle largely shifts from a position where the circuit pattern is to be drawn, the position of the reticle alignment mark also shifts by the shift of the pattern. For this reason, if the reticle is positioned on the reticle stage such that the position of the reticle alignment mark coincides with that of the reticle reference mark, each chucking pad 112 may partially project from the reticle and may be unable to properly chuck or fix the reticle.

For example, if the position where the reticle pattern surface 104 is formed shifts from an intended position, as shown in FIG. 7, a shift occurs between the center 102 of the reticle pattern surface and the center 103 of the reticle 100 itself. This shift directly results in a shift of the reticle alignment mark 101. If the reticle is arranged on the reticle stage 110 such that the reticle alignment mark 101 coincides with the reticle reference mark 111, part of the chucking pad 112 may project from the reticle 100, as shown in FIG. 8.

In this case, if the reticle chucking pad 112 is movable on the reticle stage 110, the chucking pad 112 need only be moved. Otherwise, it cannot chuck the reticle. Granted that the chucking pad 112 can chuck the reticle, its chucking force decreases. The reticle may shift or may become detached from the reticle chucking pad during a reticle scan operation. Detachment of the reticle from the reticle stage or the reticle chucking pad's inability to chuck the reticle during a reticle scan operation is a serious accident for an exposure apparatus. Much labor and expense are required to recover from the accident.

In recent years, a demand for an exposure apparatus having a high throughput leads to a demand for a further increase in scan speed. The area of a reticle chucking pad is increased to augment its chucking force, thereby supporting a high-acceleration reticle stage. This increase in area of the reticle chucking pad narrows the tolerance for a shift of a drawn circuit pattern and increases the complexity of reticle manufacture and management.

SUMMARY OF THE INVENTION

The present invention has been made in consideration of the above-mentioned problems, and has as its object to prevent a chucking pad for fixing a substrate from insufficiently fixing the substrate by managing a relative position between the substrate and the chucking pad.

To solve the above-mentioned problems, a substrate alignment apparatus according to the present invention comprises the following arrangements. That is, according to one aspect of the present invention, there is provided a substrate alignment apparatus, which aligns and fixes a substrate on a substrate stage, comprising a chucking pad fixed on the substrate stage to chuck and to fix a substrate, a moving unit which moves the substrate with respect to the substrate stage such that a mark on the substrate stage and a mark on the substrate coincide with each other, and a determination unit which manages a relative position between the chucking pad and the substrate after movement by the moving unit and determines whether the chucking pad can normally chuck the substrate.

Furthermore, according to another aspect of the invention, there is provided a substrate alignment method of aligning and fixing a substrate on a substrate stage by using a chucking pad fixed on the substrate stage to chuck and to fix a substrate, comprising a moving step of moving the substrate with respect to the substrate stage such that a mark on the substrate stage and a mark on the substrate coincide with each other, and a determination step of managing a relative position between the chucking pad and the substrate after movement in the moving step and determining whether the chucking pad can normally chuck the substrate.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 10 is a flow chart showing the manufacturing flow of a semiconductor device.

DETAILED DESCRIPTION OF THE PREFERRED EMBODIMENTS

Preferred embodiments of the present invention will now be described in detail in accordance with the accompanying drawings.

First Embodiment

Figure 9:
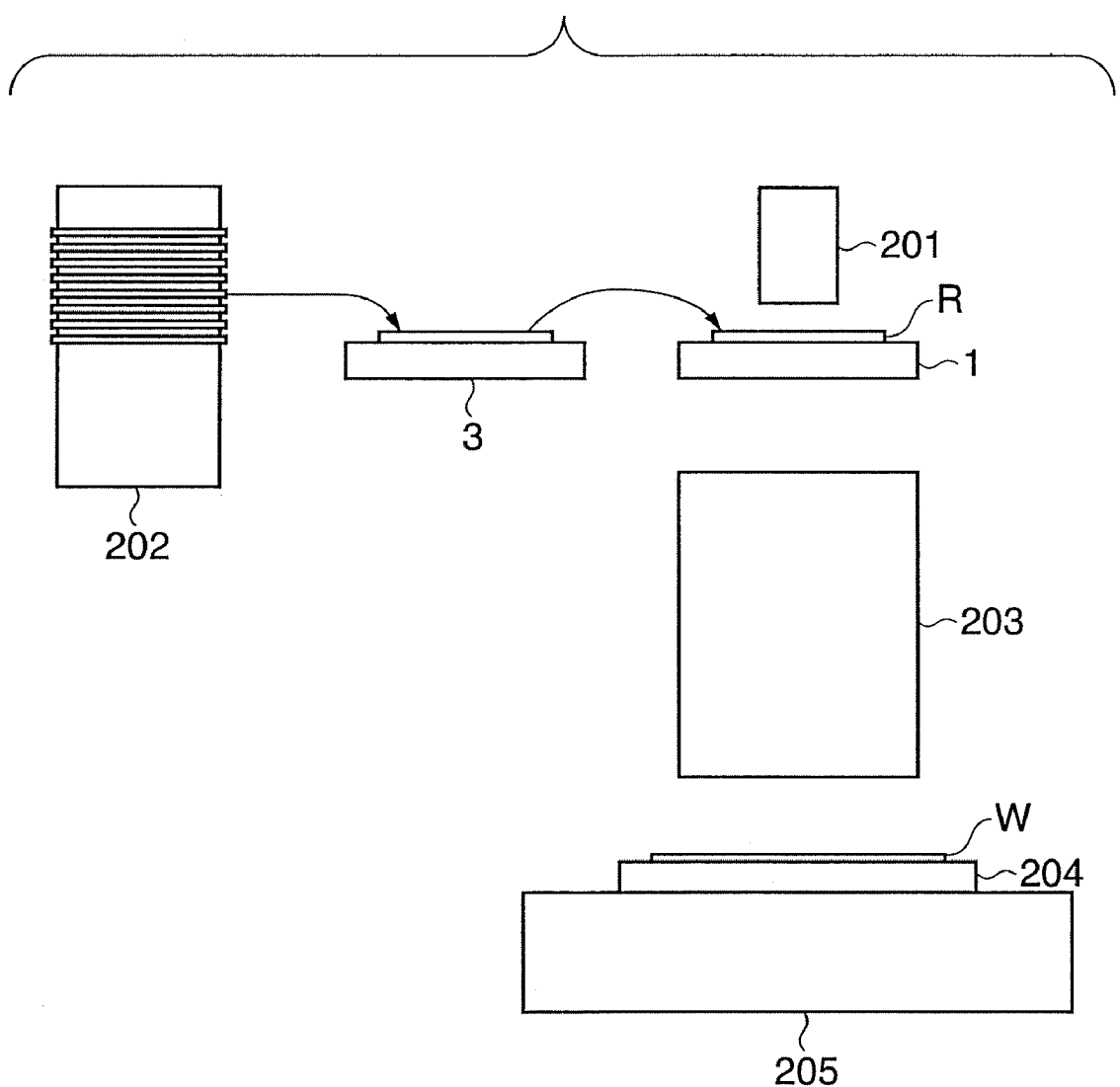
FIG. 9 is a view showing the outline of a semiconductor exposure apparatus to which a reticle alignment mechanism according to the embodiment can be applied.

FIG. 9 is a view showing the schematic arrangement of a semiconductor exposure apparatus to which a reticle alignment mechanism according to the first embodiment can be applied. In FIG. 9, exposure light emitted from an exposure light source device 201 comes incident on a reticle R on a reticle stage 1. Exposure light, which has been shaped in accordance with a pattern on the reticle R and has been transmitted through the reticle R, passed through a projection optical system 203 to form an image on a wafer stage 204. A wafer W is exposed to the pattern on the reticle R. Note that reference numeral 205 denotes a stage surface plate.

Reference numeral 202 denotes a reticle stocker, and 3, an end face alignment apparatus. The reticle is transported from the reticle stoker 202 to the end face alignment apparatus 3 by a reticle transport robot 4 shown in FIG. 1, and is further transported by a reticle transport hand 2 to the reticle stage 1 for exposure.

Figure 1:
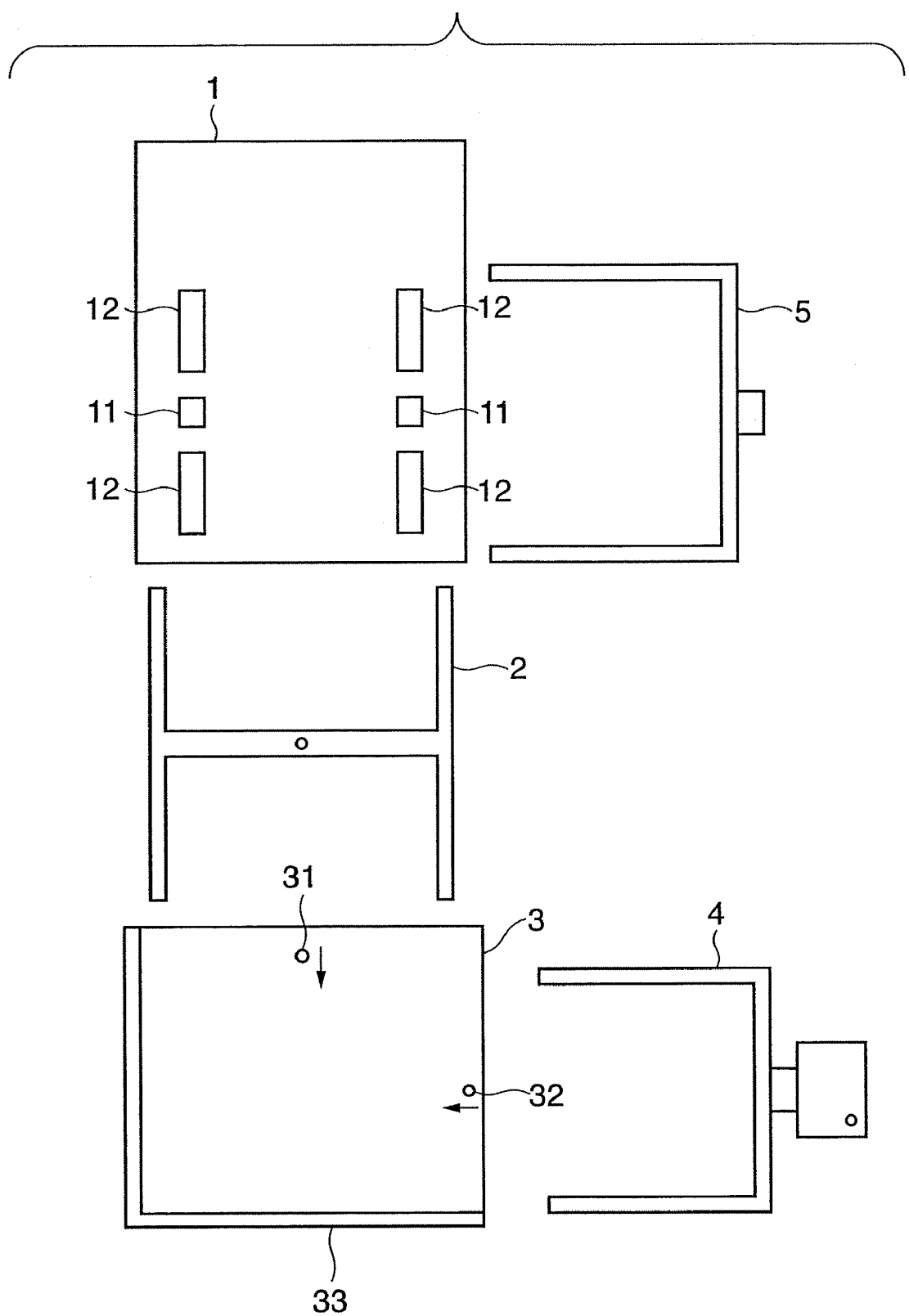
FIG. 1 is a schematic view of a reticle alignment mechanism of a semiconductor exposure apparatus according to the first embodiment.

FIG. 1 is a schematic view of a reticle alignment mechanism of a semiconductor exposure apparatus according to the first embodiment. FIG. 1 shows an arrangement for transporting a reticle from a reticle stocker to a reticle stage, aligning a reticle alignment mark and a reticle reference mark with each other, and causing a reticle chucking pad to chuck the reticle.

Reference numeral 1 denotes the reticle stage, 11, reticle reference marks, and 12, reticle chucking pads. The reticle reference marks 11 and reticle chucking pads 12 are separately fixed on the reticle stage 1. The reticle transport hand 2 transports a reticle on the end face alignment apparatus 3 to the reticle stage 1.

The end face alignment apparatus 3 aligns the reticle transported by the reticle transport robot 4 on the basis of its outer shape. More specifically, abutting pins 31 and 32 are moved in directions of a guide 33, respectively, to press end faces of the reticle against the guide 33, thereby aligning the reticle mechanically (on the basis of its outer shape). The reticle transport robot 4 picks up the reticle from a reticle stocker (not shown) and transports it to the end face alignment apparatus 3. Reference numeral 5 denotes a reticle alignment hand which moves the reticle while chucking and holding it to align the reticle alignment mark and reticle reference mark with each other. More specifically, the reticle alignment hand 5 moves the reticle relative to the reticle stage 1 by a shift between the reticle alignment mark and the reticle reference mark, thereby performing alignment.

Figure 2:
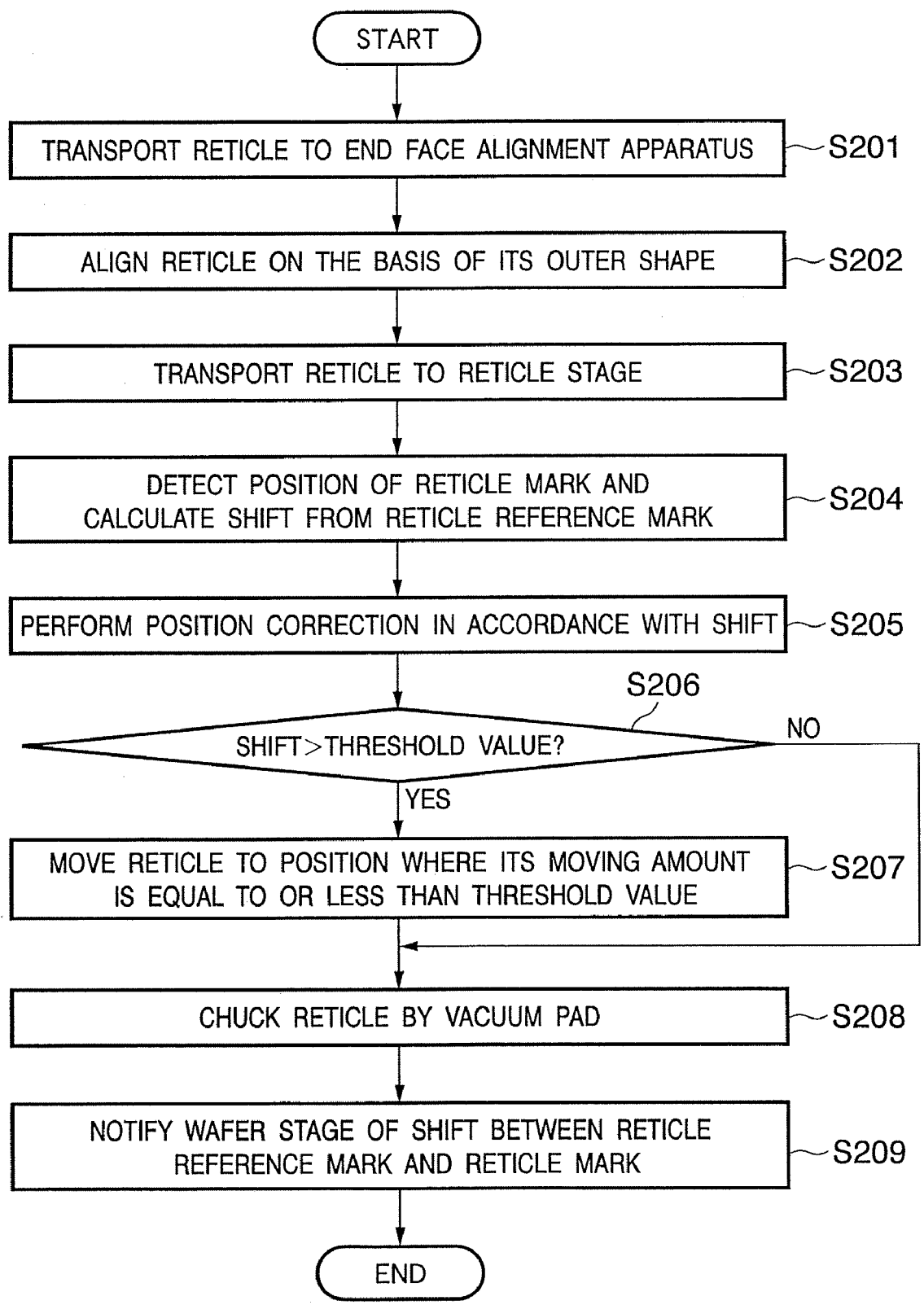
FIG. 2 is a flow chart for explaining the control procedures of a reticle alignment apparatus according to the first embodiment.

With the above-mentioned arrangement, a reticle alignment apparatus according to the first embodiment operates in the following manner. FIG. 2 is a flow chart for explaining the control procedures of the reticle alignment apparatus according to the first embodiment. The procedures shown in FIG. 2 are implemented by causing a computer built into a controller (not shown) for an exposure apparatus to execute a predetermined control program.

For example, to align a reticle 100 shown in FIG. 5 on the reticle stage, the reticle alignment apparatus operates as follows. The reticle transport robot 4 picks up a reticle stored in the reticle stocker and transports it to the end face alignment apparatus 3 (step S201). The reticle, having been transported to the end face alignment apparatus 3, is aligned by the end face alignment apparatus 3 on the basis of its outer shape (step S202). More specifically, the transported reticle is aligned by pressing it with the abutting pins 31 and 32 against the guide 33. With this operation, when the reticle is to be transported from the end face alignment apparatus 3 to the reticle stage 1 by the reticle transport hand 2, the reticle reaches a reticle transfer position (a position where the center position of the four reticle chucking pads 12 coincides with the center position of the reticle) of the reticle stage 1.

In this manner, the reticle having been aligned by the end face alignment apparatus 3 is transported by the reticle transport hand 2 to the reticle transfer position of the reticle stage 1 (step S203).

The reticle alignment mark and reticle reference mark are aligned with each other in processes of step S204 and subsequent steps. First, the transported reticle is chucked and held by the reticle alignment hand 5. The position of each of the reticle marks 101 is detected by, e.g., a camera, and a shift from the corresponding reticle reference mark 11 on the reticle stage 1 is calculated (step S204). The calculated shift is compared with a predetermined threshold value (step S205).

The threshold value will be described. If the reticle is moved by the reticle alignment hand 5 on the basis of the shift calculated in step S204, the reticle is moved from the reticle transfer position by a driving amount of the reticle alignment hand 5. That is, the reticle is shifted from the reticle chucking pads by its moving amount. For this reason, if the outer dimensions of the reticle, the position of each chucking pad, an effective region for chucking, and the like, are known, it can be determined whether the chucking pad (effective region for chucking) projects from the reticle by the movement of the reticle by the reticle alignment hand 5. The above-mentioned threshold value defines a range of the moving amount within which the chucking pad does not project from the reticle 100.

The outer dimensions of the reticle are defined by SEMI standards (Semiconductor Equipment and Materials Institute), and a position where each reticle chucking pad 12 is attached can be measured in assembling the reticle stage 1. A shift between an actual reticle position and the reticle transfer position of the reticle stage 1, to which the reticle, having undergone end face alignment by the end face alignment apparatus 3, is transported by the reticle transport hand 2, can be measured in assembling the reticle transport hand 2 and reticle stage 1. These measurement data make it possible to calculate a moving amount from the reticle transfer position (of the reticle transported to the reticle transfer position by the reticle transport hand 2), which causes insufficient chucking (an inability to chuck the reticle or chucking which may cause the reticle to shift during a reticle scan operation) of the reticle by the reticle chucking pads 12. This calculation value is assumed to be a threshold value for the moving amount of the reticle.

Figure 5:
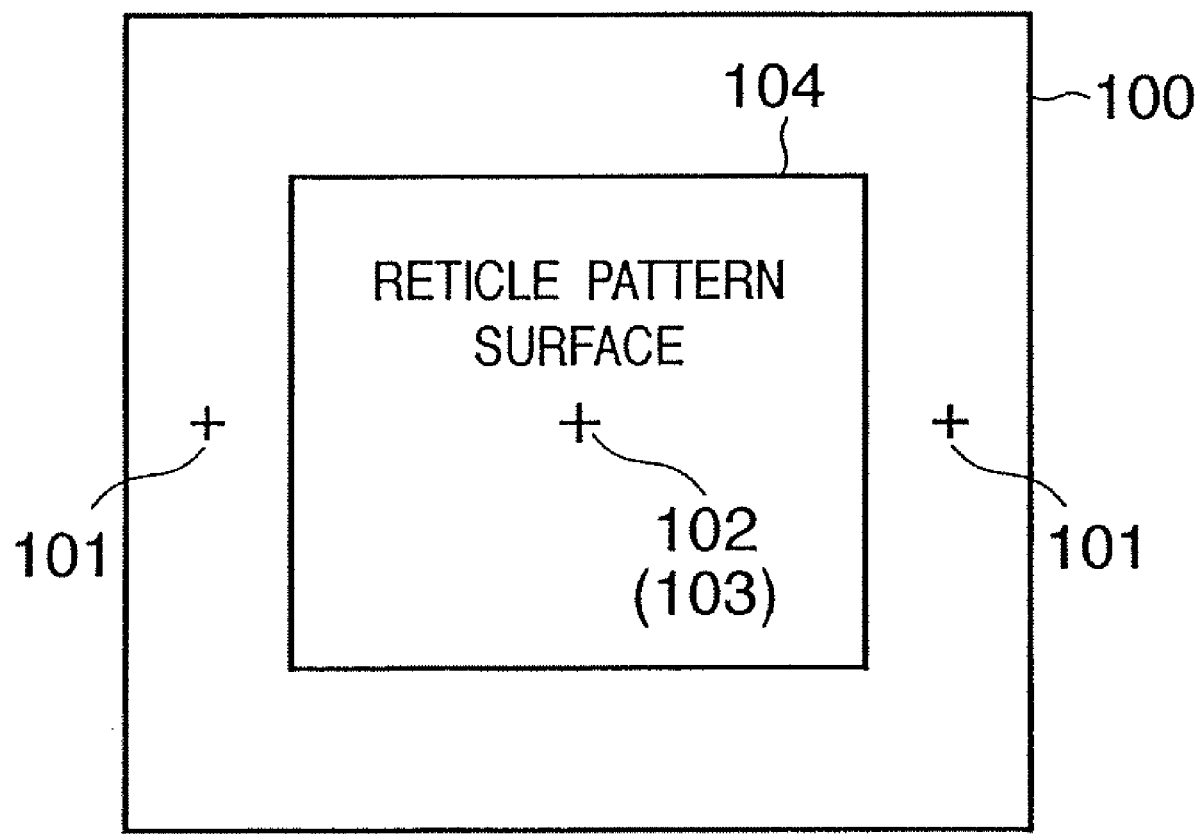
FIG. 5 is a view showing a drawing example of a reticle pattern surface and a reticle alignment mark on a reticle.
Figure 6:
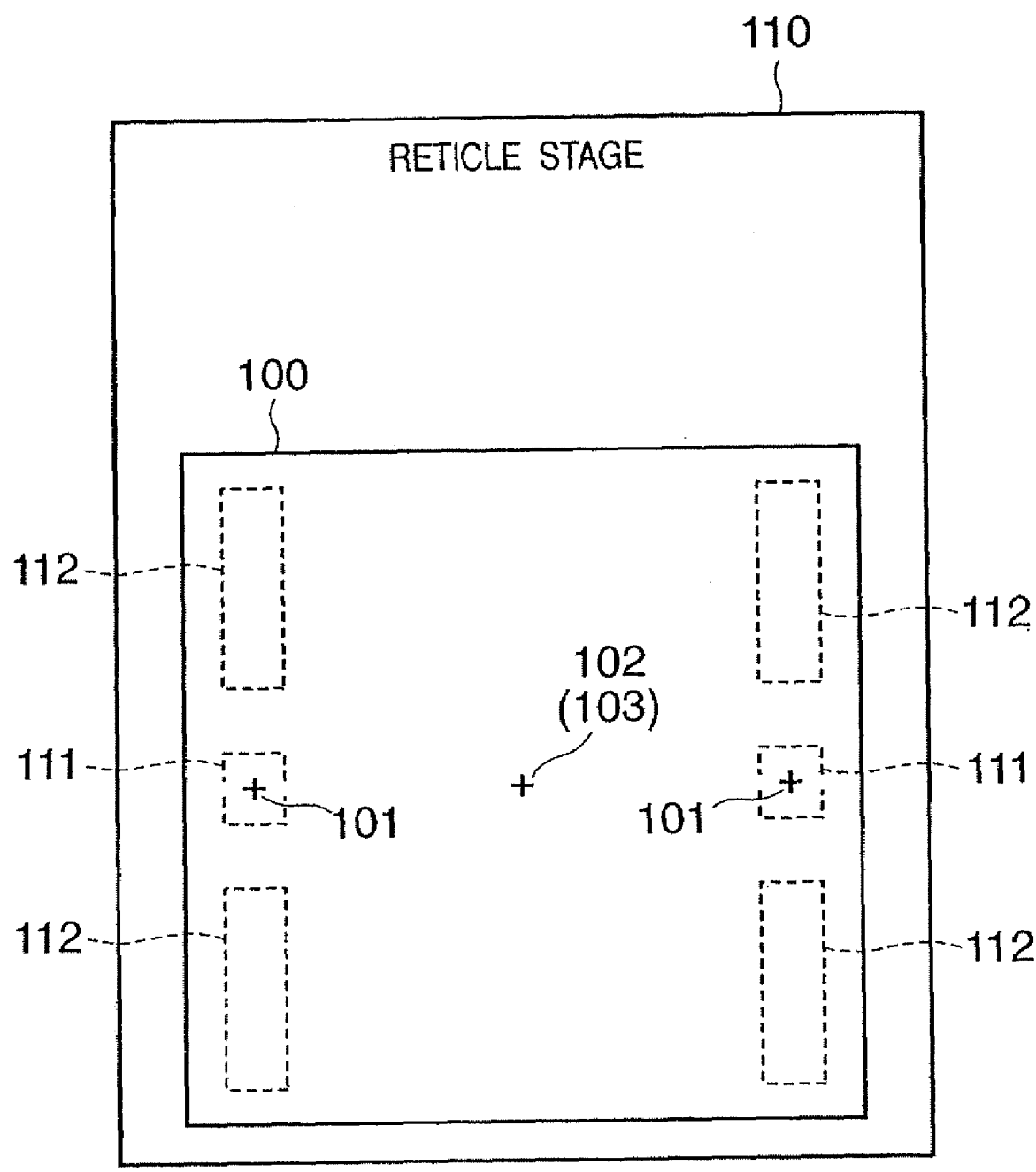
FIG. 6 is a view showing a state wherein the reticle shown in FIG. 5 is aligned on a reticle stage.

For example, in the reticle shown in FIG. 5, a reticle center 103 and a pattern center 102 substantially coincide with each other. A shift between each reticle reference mark 11 and the corresponding reticle mark 101 when the reticle is transferred onto the reticle stage 1 by the reticle transport hand 2 is smaller than the above-mentioned threshold value. Accordingly, the flow advances from step S206 to step S208. The reticle alignment hand 5 is driven by the calculated shift to move the reticle. In this manner, the reticle is moved such that the reticle mark 101 coincides with the reticle reference mark 11, thereby implementing alignment of the reticle alignment mark and reticle reference mark.

As described above, if the reticle moving amount from the reticle transfer position is equal to or less than the threshold value, the reticle alignment hand 5 aligns the reticle alignment mark and reticle reference mark with each other. After that, the reticle chucking pads 12 of the reticle stage 1 chuck the reticle, and the reticle alignment hand 5 releases the reticle.

Figure 7:
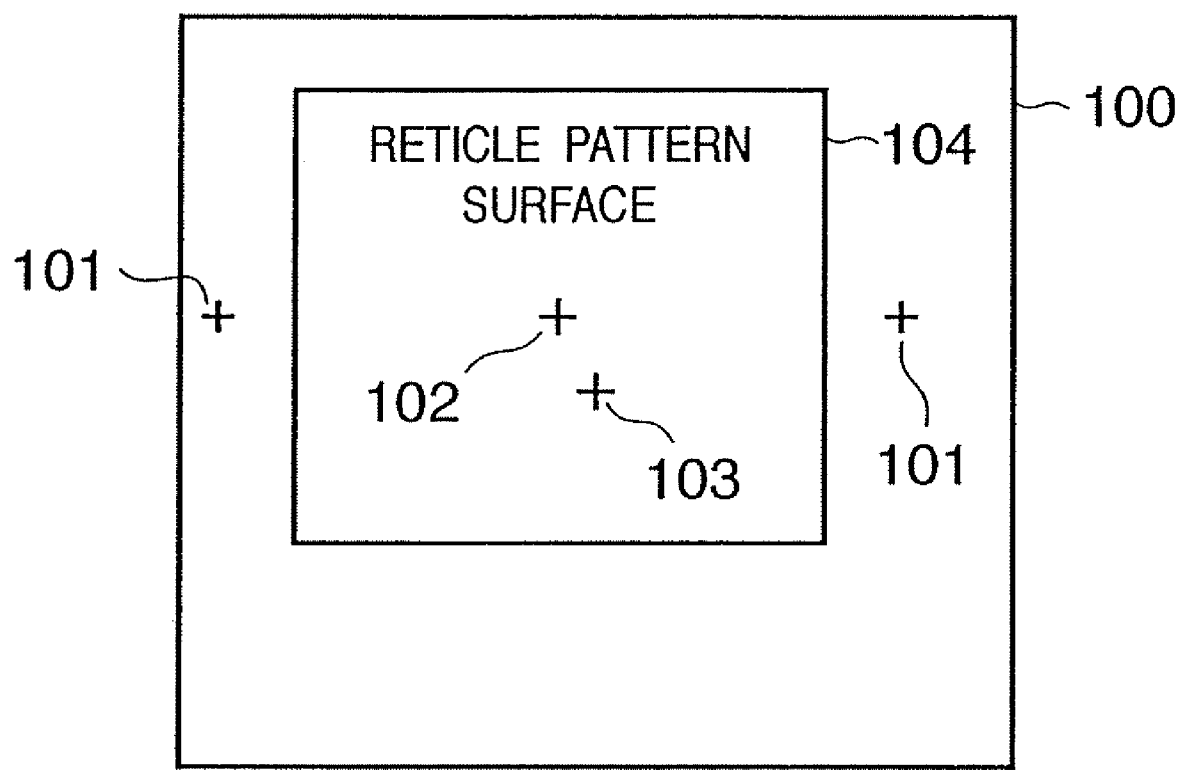
FIG. 7 is a view showing a drawing example of the reticle pattern surface and the reticle alignment mark on the reticle.
Figure 8:
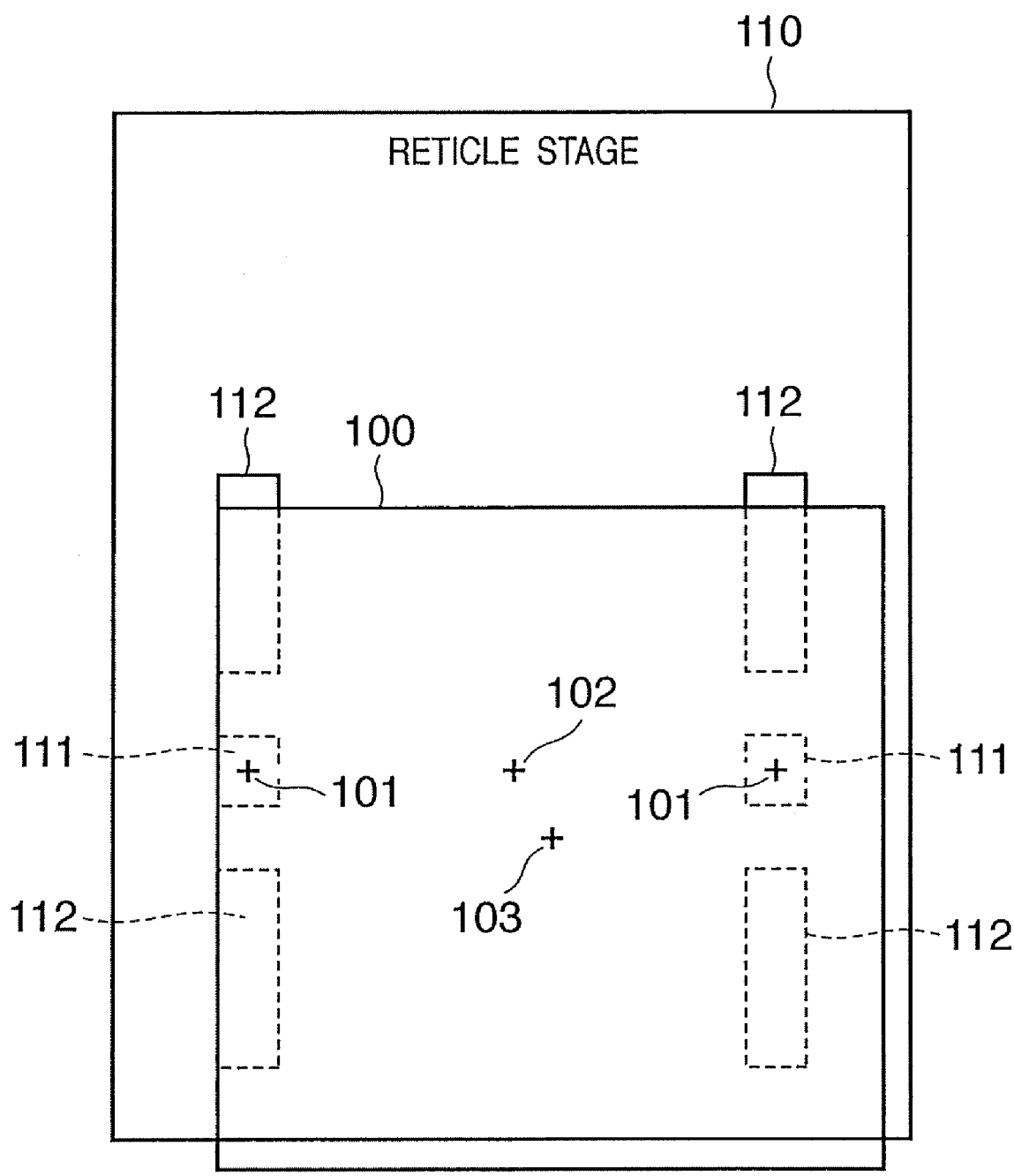
FIG. 8 is a view showing a state wherein the reticle shown in FIG. 7 is aligned on the reticle stage.

On the other hand, if the reticle moving amount exceeds the threshold value, as shown in FIGS. 7 and 8, the reticle alignment hand 5 aligns the reticle alignment mark and reticle reference mark with each other, and then moves the reticle to a position where its moving amount from the reticle transfer position is equal to or less than the threshold value (steps S206 and S207). The reticle chucking pads 12 chuck the reticle, and the reticle alignment hand 5 releases the reticle (step S208). Although this operation causes failure in alignment of the reticle alignment mark and reticle reference mark, it avoids trouble, such as an inability of some or all of the reticle chucking pads to chuck the reticle and a shift of the reticle due to a reticle scan operation.

If the wafer is shifted on the wafer stage in exposure by an amount obtained by multiplying image formation magnification of the projection optical system and a shift between the reticle alignment mark and the reticle reference mark at a position where the reticle is released from the reticle alignment hand 5, the pattern area of the reticle and that of the wafer can be aligned with each other. To implement this, a wafer stage control system is notified of a final shift between the reticle reference mark and the reticle alignment mark, as shown in step S209 of FIG. 2.

Note that a method as described above can be adopted when the reticle alignment mark and reticle reference mark are aligned with each other, not by moving the reticle alignment hand 5, which holds the reticle, but by moving the reticle stage 1. More specifically, an amount by which the reticle stage 1 is moved from the reticle transfer position to align the reticle alignment mark and reticle reference mark with each other corresponds to a shift between the reticle and each reticle chucking pad. For this reason, in step S206, the threshold value for the moving amount of the reticle stage 1 is compared with the shift between the reticle and the reticle chucking pad. If the shift exceeds the threshold value, the reticle is chucked by the reticle chucking pads only after moving the reticle stage to a position where its moving amount is equal to or less than the threshold value in step S207.

As described above, according to this embodiment, when the reticle is transported to the reticle stage 1 to align the circuit pattern area of the reticle in a system in which the reticle chucking pads are not movable, but fixed on the reticle stage, a relative position between the reticle and each reticle chucking pad is managed. It is predicted whether insufficient chucking (an inability of some or all of the reticle chucking pads to chuck the reticle or a shift of the reticle due to a reticle scan operation) occurs when the reticle is chucked by the reticle chucking pads, based on the relative positions between the reticle and the reticle chucking pads cause the position of the reticle alignment mark to coincide with that of the reticle reference mark.

If it is predicted that each reticle chucking pad cannot chuck the reticle or the reticle shifts during a reticle scan operation due to insufficient chucking by the chucking pad, alignment of the circuit pattern is stopped, and the chucking pad is moved to a position where it can reliably chuck the reticle.

Managing the relative positions between the reticle and the reticle chucking pads can avoid a failure in chucking the reticle or avoid a shift of the reticle during scanning when the position of the circuit pattern drawn on the reticle largely shifts.

In a case wherein a system can predict, before transporting the reticle to the reticle stage 1 by the reticle transport hand 2, the relative positions between the reticle and the reticle chucking pads when the reticle alignment mark and reticle reference mark are aligned with each other on the reticle stage by, e.g., detecting a position where the reticle alignment mark is drawn on the reticle, and if a predicted relative position causes insufficient chucking, transportation of the reticle to the reticle stage may be stopped.

Second Embodiment

Figure 3:
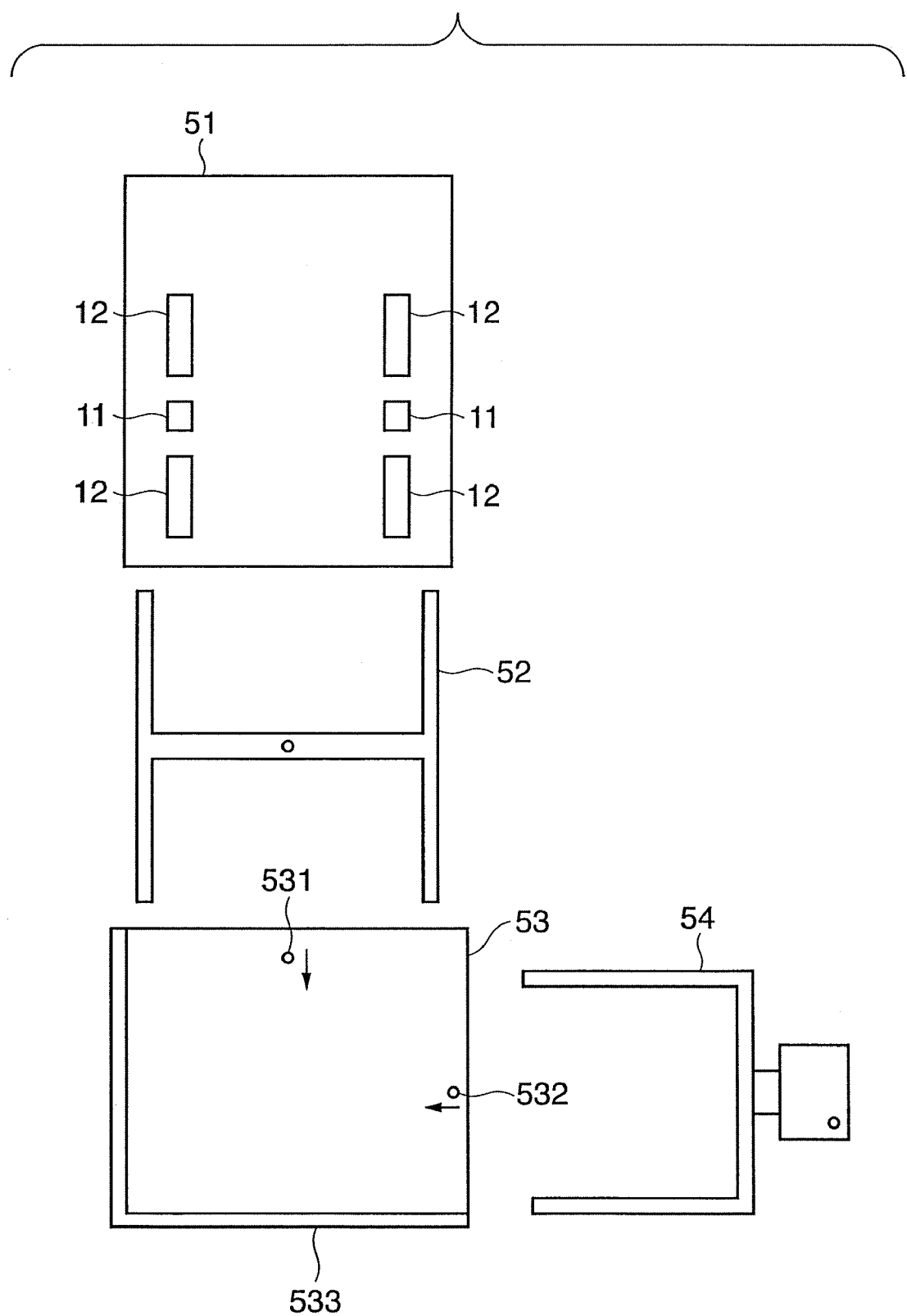
FIG. 3 is a schematic view of a reticle alignment mechanism of a semiconductor exposure apparatus according to the second embodiment.

FIG. 3 is a schematic view of a reticle alignment mechanism of a semiconductor exposure apparatus according to the second embodiment. FIG. 3 shows an arrangement for transporting a reticle from a reticle stocker to a reticle stage and causing a reticle chucking pad to chuck the reticle.

A reticle stage 51 has reticle reference marks 11 and reticle chucking pads 12 fixed on it. A reticle transport hand 52 transports a reticle from an end face alignment apparatus 53 to the reticle stage 51. The end face alignment apparatus 53 drives abutting pins 531 and 532 to press end faces of the reticle against a guide 533, thereby aligning the reticle mechanically (on the basis of its outer shape). In the second embodiment, the end face alignment apparatus 53 has a function of detecting the position of each of reticle alignment marks on the reticle, calculating a shift from a position where the reticle alignment mark should be located, and shifting the reticle by the shift from a position after the end face alignment. As a result, when the reticle transport hand 52 transports the reticle to the reticle stage 51, the position of the reticle alignment mark coincides with that of the corresponding reticle reference mark 11. Reference numeral 54 denotes a transport robot which picks up the reticle from a reticle stocker and transports it to the end face alignment apparatus.

Figure 4:
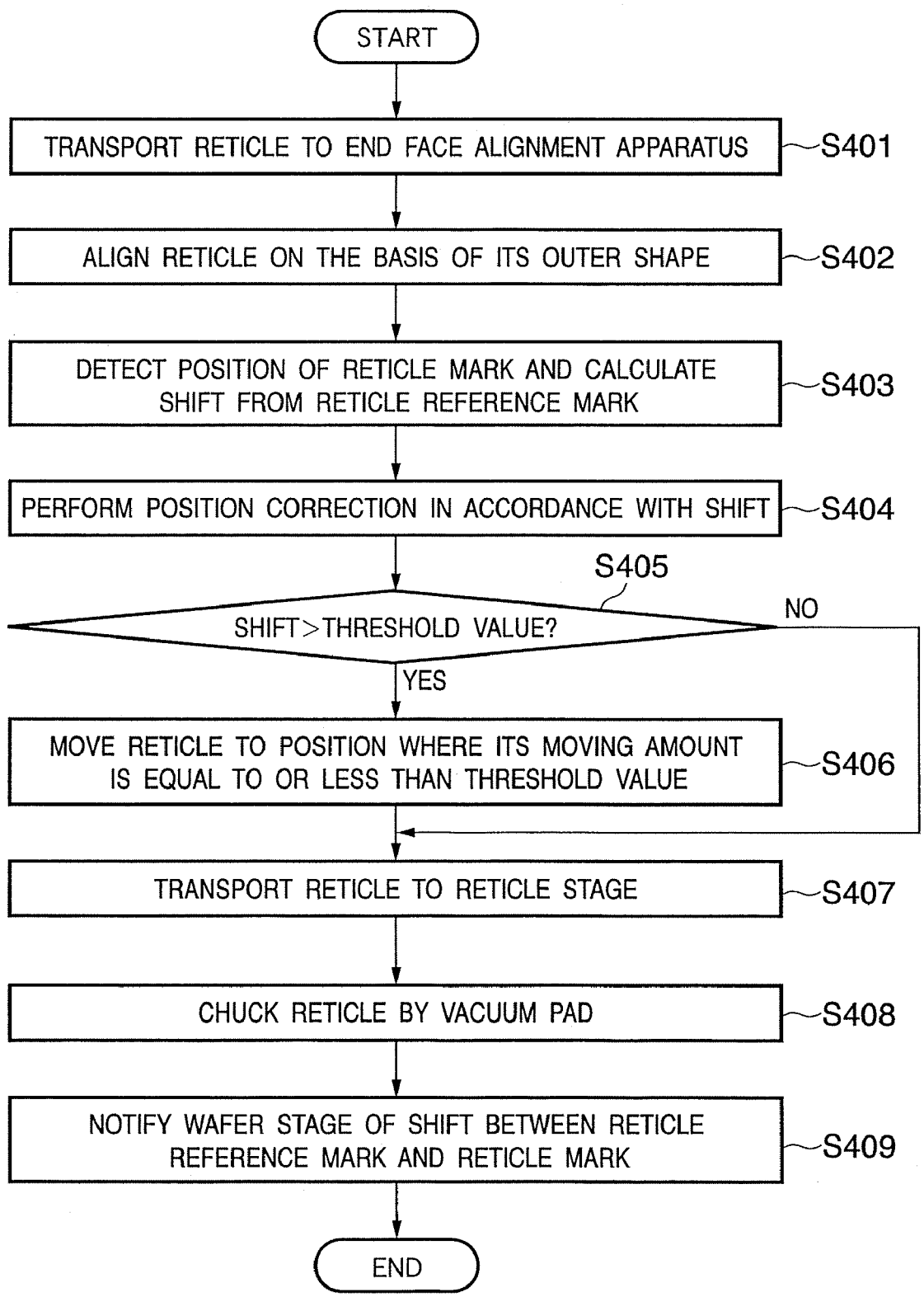
FIG. 4 is a flow chart for explaining the control procedures of a reticle alignment apparatus according to the second embodiment.

Operation of the reticle alignment mechanism having the above-mentioned arrangement according to the second embodiment will be described with reference to the flow chart of FIG. 4.

The reticle transport robot 54 picks up a reticle from the reticle stocker and transports it to the end face alignment apparatus 53 (step S401). The end face alignment apparatus 53 aligns the transported reticle on the basis of its end faces (its outer shape) (step S402). The position of each of the reticle alignment marks on the reticle is detected by, e.g., a camera (not shown), thereby calculating a shift from a position where the reticle alignment mark should be located (step S403). When the reticle transport hand transports the reticle to the reticle stage, the reticle is shifted from a position after the end face alignment to a position where the position of each reticle alignment mark coincides with that of the corresponding reticle reference mark (step S404). For example, the end face alignment apparatus 53 may comprise a stage which can be driven in the X and Y directions and may be arranged to move the stage (reticle) in the X and Y directions on the basis of the shift.

As described above, the end face alignment apparatus 53 according to the second embodiment performs end face alignment and then detects the position of each reticle alignment mark on the reticle. The end face alignment apparatus 53 calculates a shift from a position where the reticle alignment mark should be located and moves the reticle by the shift. Then, the end face alignment apparatus 53 waits for the reticle transport hand to transport the reticle to the reticle stage 51.

If the reticle transport hand transports the reticle to the reticle stage 51 in this state, the position of the reticle alignment mark coincides with that of the corresponding reticle reference mark. Accordingly, when the reticle chucking pads chuck the reticle, the reticle is fixed on the reticle stage in a state wherein the position of the reticle alignment mark coincides with that of the reticle reference mark.

The moving amount of the reticle in step S404 is a moving amount from the position of the reticle after alignment in step S402 and corresponds to a shift between each reticle chucking pad 12 and the reticle when the reticle transport hand 52 transports the reticle to the reticle stage 51. Assume that in a state wherein the shift exceeds a threshold value for the moving amount of the reticle, the reticle transport hand 52 transports the reticle to the reticle stage 51, and the reticle chucking pads chuck the reticle. In this case, insufficient chucking (an inability of some or all of the reticle chucking pads to chuck the reticle or chucking which may cause the reticle to shift due to a reticle scan operation) of the reticle occurs.

The position of the reticle on the end face alignment apparatus 53 can be transformed (coordinate transform) into a reticle transfer position on the reticle stage 51. For this reason, the moving amount of the reticle on the basis of a shift from a position where each of the reticle alignment marks should be located can be managed as a relative shift between the reticle and each reticle chucking pad. The threshold value can be set in the same manner as that in the first embodiment. If the shift exceeds the threshold value, the reticle is moved such that its moving amount is equal to or less than the threshold value or transportation of the reticle to the reticle stage 51 is stopped. With this operation, even if a circuit pattern drawn on the reticle largely shifts from a position where the circuit pattern is to be drawn, insufficient chucking (an inability of some or all of the reticle chucking pads to chuck the reticle or insufficient chucking, which may cause the reticle to shift during a reticle scan operation) by the reticle chucking pads can be avoided.

More specifically, if an amount of the position correction in step S404 is equal to or less than the threshold value, the reticle is moved to the reticle stage 51 by the reticle transport hand 52 while keeping the alignment state (step S407). On the other hand, if the amount of the position correction exceeds the threshold value, the moving amount is limited to a value equal to or less than the threshold value, and the reticle is moved to the reticle stage 51 by the reticle transport hand 52 (steps S406 and S407).

After that, the reticle stage 51 causes the reticle chucking pads 12 to chuck the transported reticle (step S408).

As described above, according to the second embodiment, a shift between the reticle and each reticle chucking pad is compared with the threshold value for the reticle moving amount, and the moving amount is limited using the threshold value. This can avoid insufficient chucking. More specifically, even if a circuit pattern drawn on the reticle largely shifts from a position where the circuit pattern is to be drawn, managing the relative positions between the reticle and the reticle chucking pads can avoid an accident, such as an inability of some or all of the reticle chucking pads to chuck the reticle due to alignment of the reticle alignment marks and reticle reference marks, or a shift of the reticle due to a reticle scan operation.

As described above, according to the embodiments, there is disclosed a substrate alignment apparatus which aligns and fixes a substrate on the substrate stage (1 and 51), comprising reticle chucking pads (12) fixed on the substrate stage to chuck and fix the substrate, a moving apparatus (the end face alignment apparatuses 3 and 53, reticle transport hands 2 and 52, and reticle alignment hands 5), which moves the substrate to cause a mark on the substrate stage and that on the substrate to coincide with each other, and a determination unit which manages the relative positions between the chucking pads and the substrate moved by the moving apparatus and determines whether the chucking pads can normally chuck the substrate.

The moving apparatus has the first apparatus (the end face alignment apparatuses 3 and 53), which aligns the substrate on the basis of its outer shape and the second apparatus (the reticle alignment hands 5 and end face alignment apparatuses 3 and 53), which detects the mark drawn on the substrate and moves the substrate by a shift from the mark on the substrate stage, and the relative positions are managed on the basis of an amount by which the second apparatus moves the substrate.

In the above description, according to the first embodiment, the first apparatus (end face alignment apparatus 3) is arranged separately from the substrate stage, and the second apparatus (alignment hand) is arranged on the substrate stage. According to the second embodiment, the first and second apparatuses are arranged on a stage (the end face alignment apparatus 53) separate from the substrate stage.

If it is determined that the reticle chucking pads (12) cannot normally chuck the substrate, the amount by which the second apparatus moves the substrate is limited to a value within a range which enables the chucking pad to normally chuck the substrate (steps S206, S207, S405, and S406). On the other hand, if it is determined that the chucking pads cannot normally chuck the substrate, alignment of the substrate may be stopped. Particularly, in the second embodiment, if it is determined that the chucking pads cannot normally chuck the substrate, transportation of the substrate to the substrate stage may be stopped.

As described above, according to the embodiments, the relative positions between the reticle chucking pads and the reticle to be transported to the reticle stage are managed. A threshold value is set for the moving amount of the reticle so as to avoid insufficient reticle chucking when the reticle is chucked to the reticle stage, and the relative positions are set so as not to exceed the threshold value. Consequently, insufficient chucking (an inability to chuck the reticle or a shift of the reticle during driving of the reticle stage) of the reticle can be avoided.

As has been described above, according to the present invention, managing the relative positions between a substrate and chucking pads for fixing it can prevent the chucking pads from insufficiently fixing the substrate.

Other Embodiment

[Application to a Semiconductor Manufacturing Apparatus]

An embodiment of a device manufacturing method using the above-described exposure apparatuses will be explained. FIG. 10 shows the manufacturing flow of a microdevice (e.g., a semiconductor chip, such as an IC or LSI, a liquid crystal panel, a CCD, a thin-film magnetic head, a micromachine, or the like).

In step 301 (circuit design), a semiconductor device circuit is designed. In step 302 (mask formation), a mask having the designed circuit pattern is formed. In step 303 (wafer manufacture), a wafer is manufactured by using a material such as silicon. In step 304 (wafer process), called a pre-process, an actual circuit is formed on the wafer by lithography using the prepared mask and wafer. Step 305 (assembly), called a post-process, is the step of forming a semiconductor chip by using the wafer formed in step 304, and includes an assembly process (dicing and bonding) and a packaging process (chip encapsulation). In step 306 (inspection), the semiconductor device manufactured in step 305 undergoes inspections, such as an operation confirmation test and a durability test. After these steps, the semiconductor device is completed and shipped (step 307).

Use of the exposure apparatus described in the first or second embodiment in the above-mentioned manufacturing method can avoid an exposure operation in a state wherein a substrate is insufficiently fixed by chucking pads. This increases the semiconductor manufacture yields and reduces downtime, thus increasing the throughput.

As many apparently widely different embodiments of the present invention can be made without departing from the spirit and scope thereof, it is to be understood that the invention is not limited to the specific embodiments thereof except as defined in the appended claims.

What is claimed is:

1. An exposure apparatus for exposing a substrate to light via a pattern of a reticle, said apparatus comprising:
    a reticle stage configured to hold the reticle and to be moved;
    a substrate stage configured to hold the substrate and to be moved;
    an alignment unit configured to align the reticle with reference to an outer shape of the reticle;
    a detection unit configured to detect a position of a mark on the reticle aligned with reference to the outer shape using said alignment unit; and
    a controller configured:
    (i) to determine whether a shift amount between a position of the mark detected by said detection unit and a reference position is not greater than a threshold;
    (ii) to perform alignment between the mark and the reference position by controlling the relative position between the reticle and said reticle stage by the shift amount in a case in which the shift amount is not greater than the threshold; and
    (iii) to control the relative position between the reticle and said reticle stage by an amount not greater than the threshold, and to perform alignment between the reticle and the substrate by moving said substrate stage by a shift amount between a position of the mark and the reference position changed due to the control of the relative position, in a case in which the shift amount is larger than the threshold.

2. An apparatus according to claim 1, further comprising a hand configured to hold the reticle and to be moved relative to said reticle stage, wherein said detection unit is configured to detect the position of the mark on the reticle held by said hand.

3. An apparatus according to claim 1, wherein said detection unit is configured to detect the position of the mark on the reticle before the reticle is transferred to said reticle stage.

4. An apparatus according to claim 1, wherein said alignment unit includes said detection unit.

5. A method of manufacturing a device, said method comprising steps of:
    exposing a substrate to light via a reticle using an exposure apparatus as defined in claim 1;
    developing the exposed substrate; and
    processing the developed substrate to manufacture the device.

6. An exposure apparatus for exposing a substrate to light via a pattern of a reticle, said apparatus comprising:
    a reticle stage configured to hold the reticle and to be moved;
    an alignment unit configured to align the reticle with reference to an outer shape of the reticle;

a detection unit configured to detect a position of a mark on the reticle aligned with reference to the outer shape using said alignment unit;

a controller configured:
(i) to determine whether a shift amount between a position of the mark detected by said detection unit and a reference position is not greater than a threshold;
(ii) to perform alignment between the mark and the reference position by controlling the relative position between the reticle and said reticle stage by the shift amount, in a case in which the shift amount is not greater than the threshold; and
(iii) to stop transfer of the reticle to said reticle stage, in a case in which the shift amount is greater than the threshold.

7. An apparatus according to claim 6, wherein said detection unit is configured to detect the position of the mark on the reticle before the reticle is transferred to said reticle stage.

8. An apparatus according to claim 6, wherein said alignment unit includes said detection unit.

9. A method of manufacturing a device, said method comprising steps of:
exposing a substrate to light via a reticle using an exposure apparatus as defined in claim 6;
developing the exposed substrate; and
processing the developed substrate to manufacture the device.

\* \* \* \* \*